US008493097B2

United States Patent
Dong et al.

(10) Patent No.: US 8,493,097 B2
(45) Date of Patent: Jul. 23, 2013

(54) CURRENT-SENSING CIRCUIT

(75) Inventors: Xiaoru Dong, Shanghai (CN); Thierry Jans, Uden (NL); Peter Christiaans, Nijmegen (NL)

(73) Assignee: NXP B.V., Eindhoven (NL)

( * ) Notice: Subject to any disclaimer, the term of this patent is extended or adjusted under 35 U.S.C. 154(b) by 57 days.

(21) Appl. No.: 13/211,055

(22) Filed: Aug. 16, 2011

(65) Prior Publication Data

US 2013/0043941 A1    Feb. 21, 2013

(51) Int. Cl.
*H03K 5/22*        (2006.01)
(52) U.S. Cl.
USPC .......................................................... 327/77
(58) Field of Classification Search
USPC .......................................................... 327/77
See application file for complete search history.

(56) References Cited

U.S. PATENT DOCUMENTS

| | | | |
|---|---|---|---|
| 5,512,849 A * | 4/1996 | Wong | 327/77 |
| 5,548,467 A * | 8/1996 | Heaney et al. | 361/93.7 |
| 7,317,355 B2 | 1/2008 | Zhao et al. | |
| 7,652,861 B2 | 1/2010 | Yamada | |
| 7,679,876 B2 * | 3/2010 | Ong et al. | 361/93.9 |
| 2005/0007189 A1 * | 1/2005 | Bo et al. | 327/541 |
| 2011/0181253 A1 * | 7/2011 | Isham et al. | 323/234 |

* cited by examiner

*Primary Examiner* — William Hernandez

(57) ABSTRACT

In one embodiment, a circuit is provided. The circuit includes a low-ohmic circuit and a a power supply node configured and arranged for providing a supply voltage across the low-ohmic circuit to a load from which current can be drawn. The circuit also includes a current reference circuit, configured and arranged for setting a current reference level that is based on a portion of the current from the power supply node, and a current-sensing circuit. The current-sensing circuit senses and is responsive to current passing through the low-ohmic circuit. The current-sensing circuit operates in a normal mode, in which the current-sensing circuit senses an amount of current passing through the low ohmic circuit that is less than the current threshold level, and in an over-current mode, in which the current-sensing circuit senses an amount of current passing through the low ohmic circuit that is greater than the current threshold level.

19 Claims, 5 Drawing Sheets

CURRENT-SENSING CIRCUIT

Current sensors are often used in a number of electrical applications. For instance, many automotive circuits such as motor, solenoid and lamp drivers, may require circuitry that can determine the current flowing in a load. For instance, such circuitry may be required to detect current levels that are potentially damaging to electronic components, for example current levels that could cause overheating. Once determined, the current levels can be controlled accordingly.

Some current-sensing solutions measure voltage across a low-ohmic sensing resistor in order to determine a current passing through the resistor. Due to process variation, these resistors may exhibit variation around 10~20%. Such variation can affect tuning and accuracy of the current-sensing circuitry. Some current-sensing solutions implement the circuit using large component values in an attempt to reduce the effect of process variation. However, the effect of variation cannot be eliminated, and use of larger components increases the chip area required to implement the sensing circuitry.

One or more embodiments may address one or more of the above issues.

In one embodiment, a circuit is provided. The circuit includes a low-ohmic circuit and a power supply node configured and arranged for providing a supply voltage across the low-ohmic circuit to a load from which current can be drawn. The circuit also includes a current reference circuit, configured and arranged for setting a current threshold level that is based on a portion of the current from the power supply node, and a current-sensing circuit. The current-sensing circuit senses and is responsive to current passing through the low-ohmic circuit. The current-sensing circuit operates in a normal mode, in which the current-sensing circuit senses an amount of current passing through the low-ohmic circuit that is less than the current threshold level, and in an over-current mode, in which the current-sensing circuit senses an amount of current passing through the low-ohmic circuit that is greater than the current threshold level.

In another embodiment, a circuit is provided that includes a transistor-based switch, a reference transistor, a current reference circuit, and a sensing circuit. The transistor-based switch is located on a current path from a supply voltage, through a load coupled to the circuit, to a ground voltage. The transistor-based switch has a first source/drain and a second source/drain, arranged in the circuit so that the first source/drain has a voltage greater than a voltage of the second source/drain. The reference transistor has a first source/drain coupled to the first voltage and a second source/drain having a third voltage. The current-sensing circuit senses and is responsive to current through the low-ohmic circuit via a pair of current paths, including a first current path from the second voltage to the ground voltage and a second current path from the third voltage to the ground voltage. The current-sensing circuit is configured and arranged to operate in two modes including a normal mode and an over-current mode, in which the current-sensing circuit respectively senses an amount of current drawn passing through the transistor based switch that is less than the current threshold level and an amount of current passing through the transistor based switch that is greater than the current threshold level. The current threshold level is equal to a current passing on the second current path scaled by a ratio of a transconductance of the reference transistor to a transconductance of the transistor based switch.

In yet another embodiment, a method is provided for current-sensing. A current is provided from a power supply node, through a current path that includes a low-ohmic circuit and a load. A current is provided from the power supply node, through a reference transistor, to a ground voltage. A current threshold level is set based on the current provided through the reference transistor and a ratio of transconductance of the low-ohmic circuit to a transconductance of the reference transistor. A current-sensing circuit is provided that senses and is responsive to current through the low-ohmic circuit, having a normal mode of operation and an over-current mode of operation. The sensing circuit is configured and arranged to operate in the normal mode while sensing an amount of current passing through the low ohmic circuit that is less than the current threshold level and to operate in the over-current mode while sensing an amount of current passing through the low ohmic circuit that is greater than the current threshold level.

The above discussion is not intended to describe each embodiment or every implementation. The figures and following description also exemplify various embodiments.

Various example embodiments may be more completely understood in consideration of the following detailed description in connection with the accompanying drawings, in which.

Figure 1:
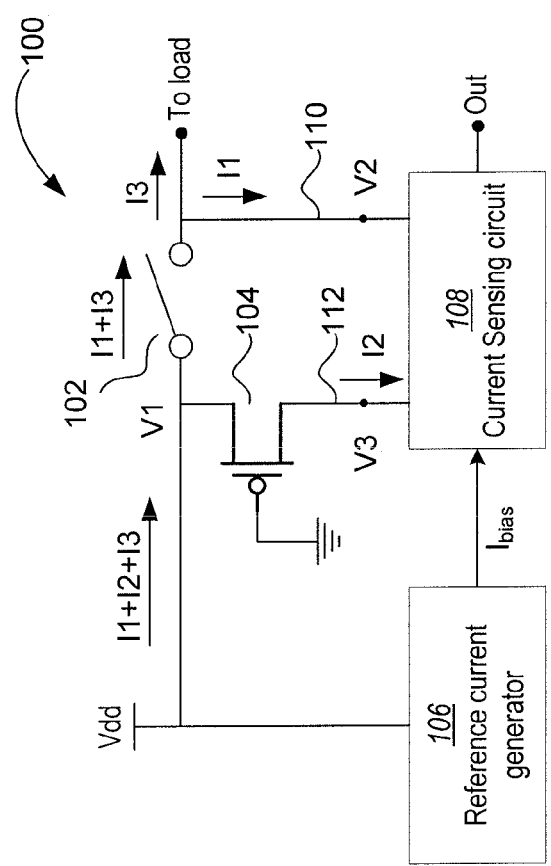
FIG. 1 shows a circuit arrangement for over-current detection in accordance with one or more embodiments.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

The disclosed embodiments are believed to be applicable to a variety of different types of processes, devices, and apparatuses, which utilize current-sensing circuits. While the embodiments are not necessarily so limited, various aspects of the disclosure may be appreciated through a discussion of examples using this context.

In one embodiment, the current-sensing circuit includes a power supply node configured and arranged for providing a supply voltage across a low-ohmic circuit to a load from which current can be drawn. The low-ohmic circuit is implemented with components that are subject to less process variation in comparison to resistors, such as a transistor-based switch. A reference transistor is arranged on a current path from the power supply node to a ground voltage. A current-sensing circuit is configured to sense current through the low-ohmic circuit using a pair of respective current paths from the reference transistor and low-ohmic circuit to ground. The current-sensing circuit is configured to operate in two modes including a normal mode, in which the pair of current paths indicate that current drawn by the load is less than a current threshold level, and an over-current mode, in which the pair of current paths indicate that current drawn by the load is greater than the current threshold level.

In one or more embodiments, the current-sensing circuit is configured to bias current through each of the pair of current paths according to a reference current. Additional current drawn through the low-ohmic circuit by a load causes a proportional voltage drop across the low-ohmic circuit. By comparing the amount of voltage drop across the low-ohmic circuit and reference transistor, current drawn by the load can be sensed.

For example, FIG. 1 illustrates a circuit arrangement for sensing a current (I1+I3) passing through a low-ohmic circuit in accordance with one or more embodiments. The circuit 100 includes a low-ohmic circuit (switch 102) located in a current path from voltage source Vdd to a load circuit. It is understood that the low-ohmic circuit, through which current can be sensed, may be implemented using a number of circuit elements. For example, in some embodiments, the low-ohmic circuit may be implemented using a transistor-based switch. When implemented in an integrated circuit, less area is required to implement the switch in comparison to the use of large polysilicon resistors. Resistors are also subject to more process variation in comparison to transistors. For ease of explanation, the low-ohmic circuit is generically illustrated as a switch 102 and may be referred to either as a switch or as a sensing switch. Furthermore, some power regulation applications include a power switch to disconnect power from a load when over-current is detected. One or more embodiments may utilize such a power switch as the low-ohmic circuit used to sense current.

The circuit 100 includes a reference transistor 104. Current-sensing circuit 108 is configured to provide a pair of respective current paths 110 and 112 from V1 through switch 102 to ground, and from V1 through reference transistor 104 to ground. The current-sensing circuit is configured to bias currents according to reference current ($I_{bias}$), which is provided by reference current generator 106. As described above, additional current (I3) drawn through switch 102 by a load, causes a proportional voltage drop across switch 102. As a result, voltage V2 will decrease in comparison to voltage V3. In this manner, current-sensing circuit 108 can directly sense current I3 drawn by the load without any transformation.

In some embodiments, the current-sensing circuit is configured to output an alarm signal (Out) indicating when the sensed current has exceeded a reference current threshold. Depending on the application, the output alarm signal can be either internally used (e.g., as feedback for controlling a power switch in a power regulation circuit) or as warning signal for external circuits such as the load.

In one or more embodiments, the current-sensing circuit 108 may be configured to operate in a normal mode and an over-current mode of operation, responsive to the current sensed through switch 102. The current-sensing circuit 108 operates in the normal mode in response to in which the pair of current paths indicating that current passing through switch 102 (i.e., I1+I3) is less than a current threshold level, and operates in the over-current mode in response to the pair of current paths indicating that current passing through the switch 102 is greater than the current threshold level. In some embodiments, the current-sensing circuit 108 may be configured to set a value of the alarm signal (Out) based on the mode in which the current-sensing circuit is operating.

Figure 2:
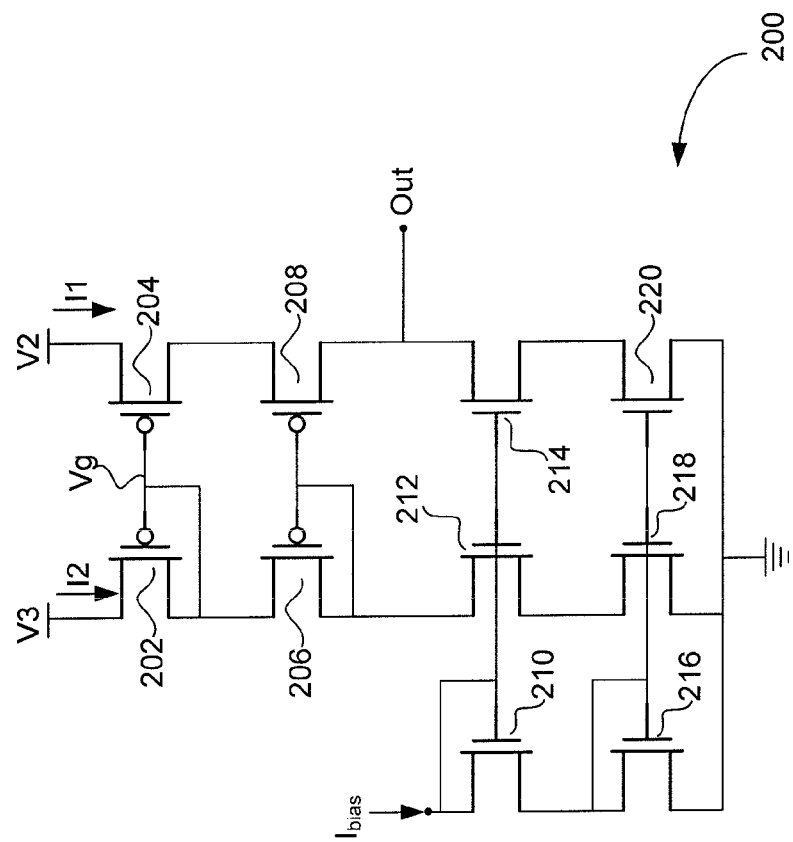
FIG. 2 shows a current-sensing circuit according to one embodiment.

As an example, FIG. 2 shows a current-sensing circuit according to one embodiment. The current sensing circuit 200 may be used, for example, to implement the current-sensing circuit 108 shown in FIG. 1. For ease of explanation, the current-sensing circuit 200 is described with reference to the current-sensing application shown in FIG. 1. As described with reference to current-sensing circuit 108, the current-sensing circuit 200 may be used to sense current I3 through switch 102 via a pair of current paths (V2 to ground and V3 to ground). In this example, the current paths are each biased by NMOS current mirror (216, 218 and 220) to cause the pair of current path to each allow currents proportional to the reference current $I_{bias}$ to pass.

In this example, the current-sensing circuit 200 is operated in normal and over-current modes by PMOS current mirror 202 and 204. PMOS transistor 202 generates a reference gate voltage (Vg) that is proportional to the current I2. Assuming $I_{bias}$ and V3 remain constant, the gate voltage Vg remains fixed. Because voltage Vg is constant, increases/decreases in the V2 voltage cause PMOS transistor 204 to operation in different operating regions according to the current to be sensed.

For example, initially, the output (Out) is set to a high voltage (close to Vdd) due to the linear operation region of PMOS 204 and PMOS 208 so that supply current fluctuation less than the threshold will not trigger the output. The boundary drain-source voltage between the linear and saturation region shifts to a lower voltage if the gate-source voltage (V2−Vg) decreases. Until the current to be sensed has reached the reference current threshold, the gate-source voltage of PMOS 204 is small enough to keep PMOS 204 operating in the saturation region. When current exceeds the reference current threshold, the gate-source voltage causes PMOS 204 to switch off. As a result, the value of Out will drop to a lower voltage and may be used to indicate whether the sensed current is greater than or less than the reference current threshold.

In one or more embodiments, the reference current threshold may be adjusted by adjusting the bias currents via $I_{bias}$. For example, when bias current passed by NMOS transistors 218 and 220 increases, for a certain size of reference transistor 104 shown in FIG. 1, the voltage drop across the reference transistor 104 increases (Vref=Ibias*Rref). As a result, V3 and Vg decrease and the range of the gate-source voltage in which PMOS 204 operates in a saturation state, relative to V2, is adjusted so that the current threshold level increases. Similarly, when bias current passed by NMOS transistors 218 and 220 is reduced, the voltage drop across the reference transistor 104 decreases. As a result, V3 and Vg increase and the range of the gate-source voltage in which PMOS 204 operates in a saturation state, relative to V2, is adjusted so that the current threshold level decreases. The current threshold level ($I_{thresh}$) is given by, $$I_{thresh}=I2*(R_{ref}/R_{switch}),$$

where $R_{ref}$ is the resistance of the reference transistor 104 shown in FIG. 1 and $R_{switch}$ is the resistance of the switch 102 shown in FIG. 1. In this manner, by adjusting bias currents, via $I_{bias}$, the current threshold level of detection can be adjusted.

Referring again to FIG. 1, in some embodiments, the voltage threshold may be set to a desired threshold by adjusting the size of PMOS 104. The size of PMOS 104 is determined by the current ratio between PMOS 104 and supply current. By applying different gate widths and/or lengths of PMOS 104, or adjusting the bias current as described above, the current threshold for sensing can be tuned to adjust the current threshold level of the sensing circuit.

Because the bias current is a dominant parameter in determining the current threshold, fairly large dimensions for transistors of current mirror 216, 218, and 220 may be selected for some applications to provide greater control of the reference current threshold.

The large size of (NMOS 218 220) may cause large parasitic capacitance at the output. In the condition of low bias current, the response time of the circuit to sense the current may be diminished as a result. One or more embodiments include a third current mirror, 206 and 208 and a fourth current mirror 210, 212, 214 to isolate the first and second current mirrors 202, 204, 216, 218, 220 from the output Out. Transistors 206, 208, 212, and 214 should be sufficiently small in comparison to transistors 202, 204, 218, and 220 in order to accelerate the response time.

Figure 3:
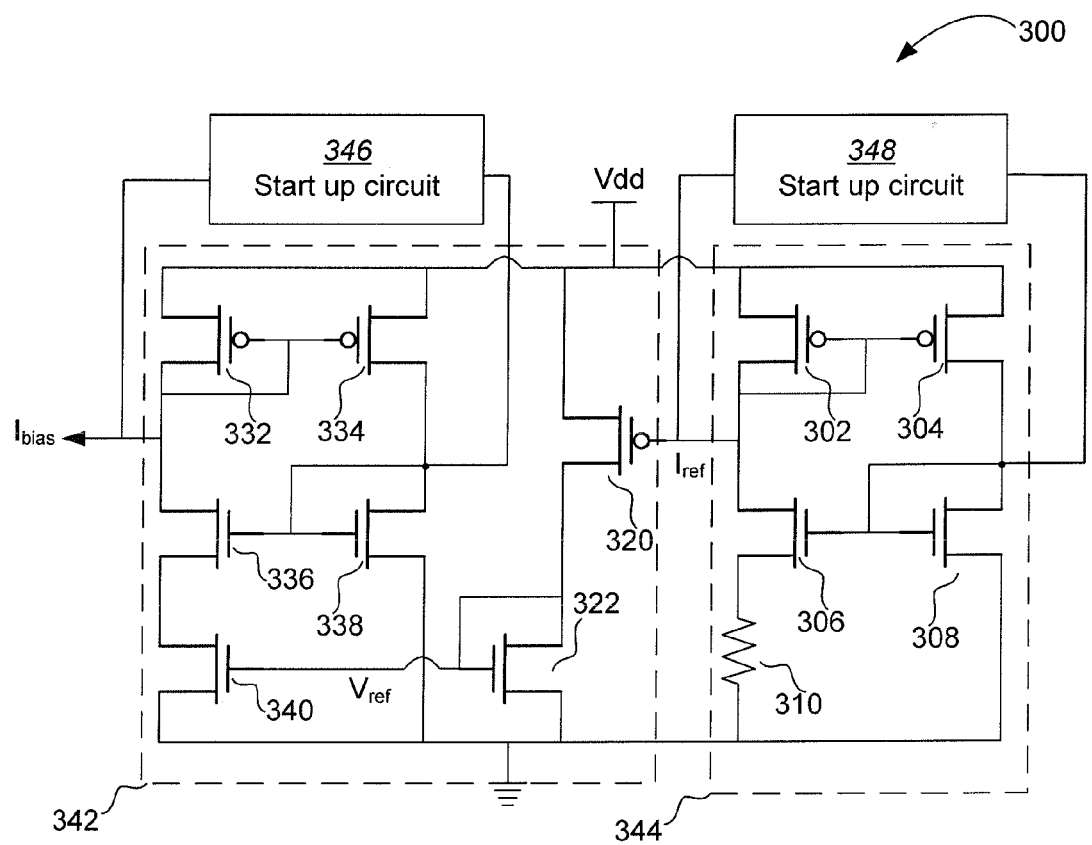
FIG. 3 shows a reference current circuit according to one embodiment.

FIG. 3 shows a reference current circuit according to one embodiment. The reference circuit may be used, for example, to implement the reference current generator 106 shown in FIG. 1. In this example, the reference current generation circuit 300 includes respective first and second stages 344 and 342. The first stage 344 includes four transistors 302, 304, 306, and 308, and a resistor 310 arranged in a bootstrap configuration. The bootstrap configuration implemented in the first stage 344 is sensitive to both power and process variations of resistor 310, $$I_{ref} = \frac{2}{\mu C_{ox}(W/L)_N} * \frac{1}{R^2}\left(1 - \frac{1}{\sqrt{k}}\right)^2$$

As discussed above, resistors have around 10~20% deviation. Even if the large components are used to reduce the variation effect, the effect of variation cannot be eliminated. For this reason, if a single stage bootstrap circuit, like that implemented in stage 344, $I_{ref}$ output from the first stage may not be sufficiently accurate for some applications.

To avoid the effect of process variation, a second stage 342 is incorporated, having five transistors 332, 334, 336, 338, and 340, which are arranged in a manner similar to the bootstrap configuration of the first stage 344, except that the function of resistor 310 is performed by NMOS 340. In comparison to resistors, transistors are less subject to process variation.

However, the resistor cannot simply be replaced with a NMOS transistor because the reference output cannot directly feedback to generate the bias gate voltage without forming a positive feedback loop.

The output of the first stage $I_{ref}$ is used to generate a bias gate voltage for the NMOS implemented resistor 340. Transistors 320 and 322 operate in a manner similar to a current mirror in order to convert the first stage output current to an NMOS gate voltage (Vref) for NMOS 340. Since the resistor 310 in reference circuit 300 does not directly determine the $I_{bias}$, the effect of any process variation of the resistor is reduced.

The resistor 310 of stage 344 may also assist to compensate for the temperature coefficient of the circuit. It is proved to achieve the temperature coefficient TC@ (−40~85° C.): ΔVref/ΔT=110 ppm/° C. which is a considerable result in normal application. In one or more embodiments, the resistor may be optimized based on the temperature coefficient of the entire block including current-sensing circuit 108, low-ohmic switch 102 and reference transistor 104, rather than the reference circuit 300. For example, when used to implement the reference current generator 106 shown in FIG. 1, the resistor may be optimized based on the output signal (Out) to achieve temperature insensitivity.

In this example, the reference current generator circuit 300 includes start up circuits 346 and 348 to prevent the self-biased circuit from remaining in the zero-current state. Once start up is complete, the startup circuit will not affect the reference operation. Therefore, the startup circuit can be implemented by any general structures without affecting the output deviation due to process variation.

Figure 4:
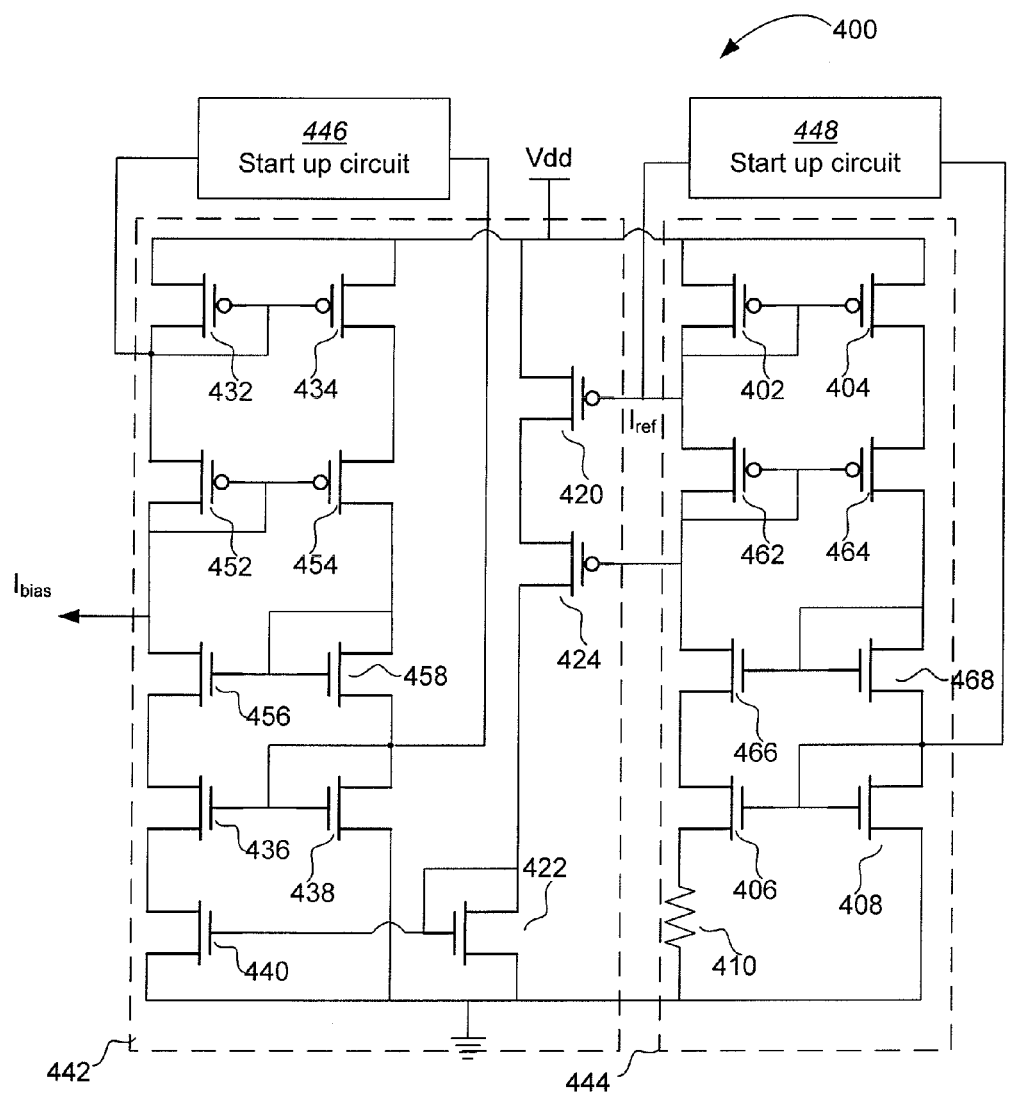
FIG. 4 shows a reference current circuit according to another embodiment.

Simulation shows the spread of the output current is 38% smaller than an existing bandgap IP. If the voltage headroom is enough, it may be adapted in a cascade configuration to reduce the effects of the finite $r_0$ of MOS, which is further beneficial for the power-supply independency. FIG. 4 shows a reference current circuit according to another embodiment. The reference circuit 400 may be used, for example, to implement the reference current generator 106 shown in FIG. 1. Similar to the reference circuit 300 shown in FIG. 3, reference circuit 400 includes first and second reference generation stages arranged. The first stage 444 includes four transistors 402, 404, 406, and 408, and a resistor 410 arranged in a bootstrap configuration as described with reference to FIG. 3. In addition, the first stage includes a PMOS current mirror (462 and 464) arranged in a cascade configuration with a current mirror implemented by PMOS transistors 402 and 404. The first stage also includes a NMOS current mirror (466 and 466) arranged in a cascade configuration with a current mirror implemented by NMOS transistors 406 and 408. The second stage 342 includes five transistors 332, 334, 336, 338, and 340, which are arranged in a bootstrap configuration similar to that described with reference to stage 342 of FIG. 3. Like the first stage, the second stage includes a PMOS current mirror (452 and 454) and an NMOS current mirror (456 and 458) respectively coupled in a cascade configuration with current mirrors implemented by transistors 432 and 434, and by transistors 436 and 438.

As described with reference to FIG. 3, the output $I_{ref}$ of the first stage 444 is used to generate a bias gate voltage for the NMOS implemented resistor 440 of the second stage 442. Transistors 420, 422, and 242 operate in a manner similar to a current mirror in order to convert output gate voltages of PMOS 420 and PMOS 424 to an NMOS gate voltage for NMOS 440.

Like the reference current generator circuit 300 shown in FIG. 3, reference current generator 400 also includes start up circuits 446 and 448 to prevent the self-biased circuit from remaining in the zero-current state. Once start up is complete, the startup circuit will not affect the reference operation. Therefore, the startup circuit can be implemented by any general structures without affecting the output deviation due to process variation.

Figure 5:
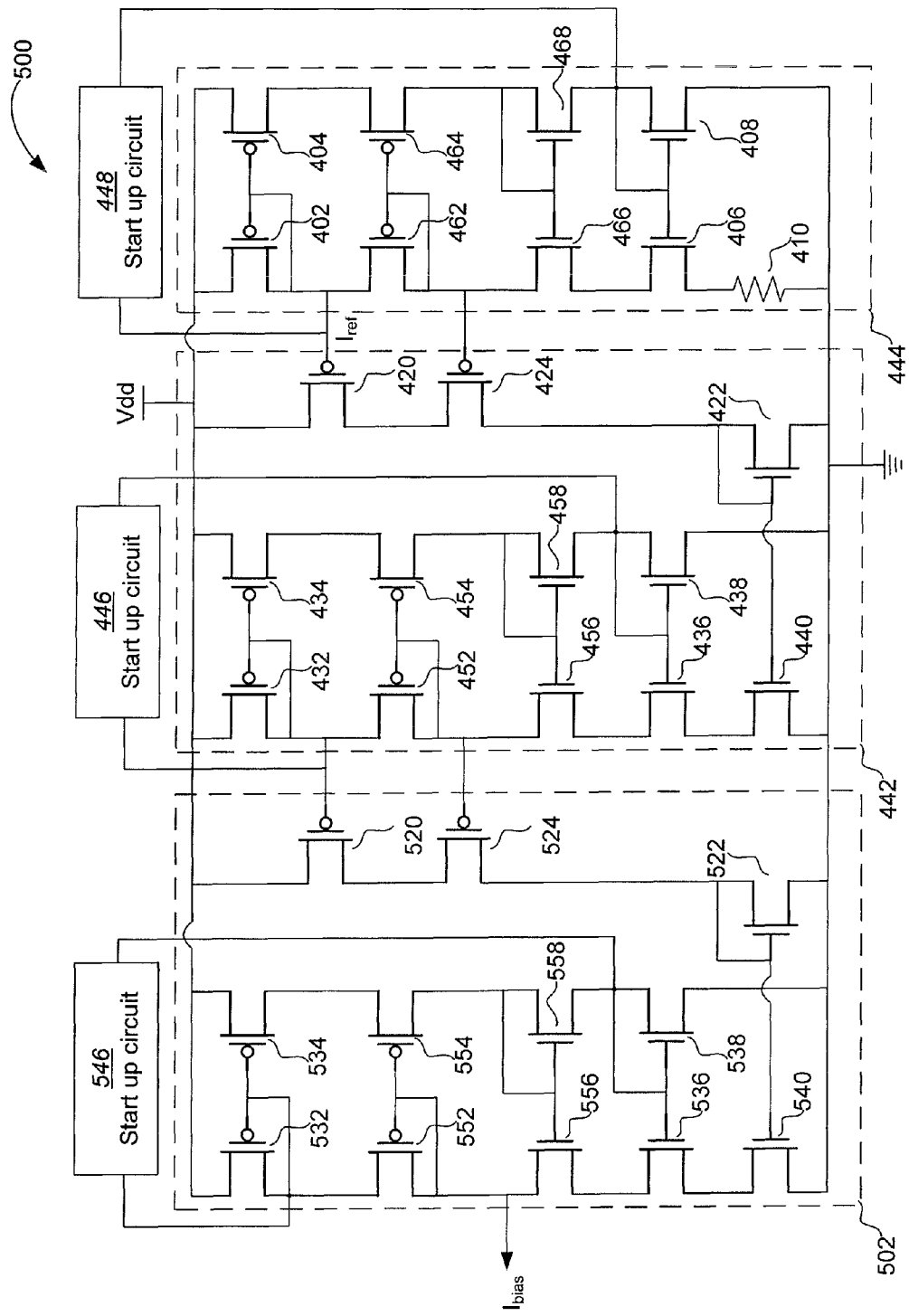
FIG. 5 shows the reference current circuit of FIG. 4 implemented with an additional stage.

In one or more embodiments, the reference current generator circuits shown in FIG. 3 and FIG. 4 may be adapted to include additional stages to further stabilize the generated output current. For example, FIG. 5 shows the reference current generator circuit show in FIG. 4 implemented with three stages 442, 444, and 502. The first two stages are 442 and 444 are implemented as described with reference to FIG. 4. The additional stage 502 includes transistors 520-558 and start up circuits 546 and 548 configured and arranged in a manner similar to transistors 420-458 and start up circuits 446 and 548 of stage 442 as described with reference to FIG. 4. The bias gate voltage of transistor 540 is controlled by an output current of stage 442.

As a result, the bias gate voltage of transistor 540 will be more stable in comparison to the bias gate voltage of transistor 440. In this manner, a very stable reference current compared with a single bandgap may be generated. Simulation shows the additional stage 502 can achieve approximately 30% lower spread of the output of the former stage 442. It is understood that the reference current generator 500 may be implemented using any number of stages.

Based upon the above discussion and illustrations, those skilled in the art will readily recognize that various modifications and changes may be made without strictly following the exemplary embodiments and applications illustrated and described herein. Furthermore, various features of the different embodiments may be implemented in various combinations. Such modifications do not depart from the true spirit and scope of the present disclosure, including those set forth in the following claims.

What is claimed is:

1. A circuit comprising:
   a low-ohmic circuit;
   a power supply node configured and arranged for providing a supply voltage across the low-ohmic circuit to a load ("other blocks") from which current can be drawn;
   a current reference circuit configured and arranged for setting a current threshold level based on and drawing a portion of the current from the power supply node; and
   a current-sensing circuit, responsive to and sensing current through the low-ohmic circuit, configured and arranged for operating in a normal mode, in which the current-sensing circuit senses an amount of current passing through the low-ohmic circuit that is less than the current threshold level, and in an over-current mode, in which the current-sensing circuit senses an amount of current passing through the low-ohmic circuit that is greater than the current threshold level.

2. The circuit of claim 1, wherein the low-ohmic circuit includes an FET-based switch and does not include a resistor.

3. The circuit of claim 1, wherein the current reference circuit has at least one cell with a mirror circuit.

4. The circuit of claim 1, wherein:
   the current reference circuit has an output node configured and arranged for providing the current reference level and has at least two stages;
   each of said at least two stages including a respective current mirror;
   a first one of the at least two stages having a resistor configured and arranged to compensate the temperature coefficient; and
   a second one of the at least two stages having a transistor-based structure configured and arranged to lower the process variation of an output current of the output node, a gate voltage of the transistor-based structure controlled by an output current of the first one of the two stages.

5. The circuit of claim 4, wherein each of the at least two stages includes an additional current mirror coupled to the first mentioned current mirror in a cascade arrangement.

6. The circuit of claim 4, wherein the current reference circuit further includes an additional stage having a current mirror and a transistor-based structure configured and arranged to lower process variation of the output current of the output node, a gate voltage of the transistor-based structure of the additional stage being controlled by an output current of the second of the at least two stages.

7. The circuit of claim 1 wherein:
   the low-ohmic circuit is a power switch;
   the current sensing circuit is configured and arranged to generate a signal in response to operating in the over-current state of operation; and
   the power switch is configured and arranged to break a current path to the load in response to the signal.

8. A circuit comprising:
   a transistor-based switch located on a current path from a supply voltage, through a load coupled to the circuit, to a ground voltage, the transistor-based switch having a first source/drain and a second source/drain, the first source/drain having a first voltage greater than a second voltage of the second source/drain;
   a reference transistor having a first source/drain coupled to the first voltage and a second source/drain having a third voltage; and
   a current-sensing circuit, responsive to and sensing current through the transistor-based switch via a pair of current paths, including a first current path from the second voltage to the ground voltage and a second current path from the third voltage to the ground voltage, the current-sensing circuit is configured and arranged for operating in a normal mode, in which the current-sensing circuit senses an amount of current passing through the transistor based switch that is less than a current threshold level, and in an over-current mode, in which an amount of current passing through the transistor based switch is greater than the current threshold level, the current threshold level being equal to a current passing through the second current path scaled by a ratio of a transconductance of the reference transistor to a transconductance of the transistor based switch.

9. The circuit of claim 8, further including a control circuit and an output signal configured and arranged to indicate which of the two modes is in operation, where the control circuit is configured and arranged to respond to the output signal by generating a signal that causes the transistor-based switch to break a current path to the load.

10. The circuit of claim 8, wherein a current-reactive circuit includes an FET-based circuit configured and arranged to cause switching between the normal and over-current modes by transitioning the FET-based circuit between linear and saturation operation regions.

11. The circuit of claim 8, wherein the current-sensing circuit includes a current mirror having a first transistor on the first current path and a second transistor on the second current path.

12. The circuit of claim 11, wherein:
    the first and second transistors of the current mirror are PMOS transistors; and
    the current-sensing circuit includes a biasing circuit configured and arranged to bias a current on each of the first and second current paths of the current-sensing circuit according to a reference current generated by a current reference circuit, such that a gate to source voltage of the first transistor of the current mirror is inversely proportional to the current passing through the transistor based switch.

13. The circuit of claim 12, wherein the current-sensing circuit is configured and arranged to bias the current on each of the first and second current paths of the current-sensing circuit to be equal to the current threshold level scaled by a ratio of a transconductance of the transistor based switch to a transconductance of the reference transistor.

14. The circuit of claim 12, wherein the biasing circuit includes:
    a second current mirror located on each of the first and second current paths between the first mentioned current mirror and the ground voltage, the second current mirror configured and arranged to bias current on the first current path according to the current reference level and bias current on the second current path according to the current reference level.

15. The circuit of claim 14, wherein
    the current-sensing circuit includes:
    an output node located between the first and second current mirrors on the first current path of the sensing circuit;

a third current mirror located between the first mentioned current mirror and the output node on the first current path; and a fourth current mirror located between the second current mirror and the output node on the first current path.

16. The circuit of claim 15, wherein the gate dimensions of the transistors of the first mentioned current mirror and the second current mirror are larger than gate dimensions of the transistors of the third and fourth current mirrors.

17. A method comprising:

providing a current through a current path from a power supply node that includes a low-ohmic circuit and a load;

providing a current from the power supply node, through a reference transistor, to a ground voltage;

setting a current threshold level based on the current provided through the reference transistor and a ratio of a transconductance of the low-ohmic circuit to a transconductance of the reference transistor;

providing a current-sensing circuit, responsive to and sensing current through the low-ohmic circuit, having a normal state of operation and an over-current state of operation;

during the normal state of operation, sensing an amount of current passing through the low-ohmic circuit that is less than the current threshold level; and during the over-current state of operation, sensing an amount of current passing through the low-ohmic circuit that is greater than the current threshold level.

18. The method of claim 17, further including generating an output signal to indicate which state the current sensing circuit is in, wherein the output signal causes a breakage in a current path to the load.

19. The method of claim 17, wherein setting a current threshold level includes:

generating a reference current;

scaling the current provided from the power supply through a reference transistor to the ground voltage according to the reference current to generate a reference voltage, the reference current being equal to the current threshold level scaled by a ratio of a transconductance of the low-ohmic circuit to a transconductance of the reference transistor.

* * * * *